United States Patent
Ide et al.

(10) Patent No.: US 8,421,235 B2
(45) Date of Patent: Apr. 16, 2013

(54) SEMICONDUCTOR DEVICE WITH HEAT SPREADERS

(75) Inventors: Shigeo Ide, Anjo (JP); Akihiro Niimi, Nagoya (JP)

(73) Assignee: Denso Corporation, Kariya (JP)

( * ) Notice: Subject to any disclaimer, the term of this patent is extended or adjusted under 35 U.S.C. 154(b) by 28 days.

(21) Appl. No.: 13/173,347

(22) Filed: Jun. 30, 2011

(65) Prior Publication Data
US 2012/0001341 A1 Jan. 5, 2012

(30) Foreign Application Priority Data

Jun. 30, 2010 (JP) ................................ 2010-149671
Mar. 11, 2011 (JP) ................................ 2011-054368

(51) Int. Cl.
*H01L 23/473* (2006.01)
*H01L 25/10* (2006.01)
*H01L 23/48* (2006.01)
*H01L 25/07* (2006.01)

(52) U.S. Cl.
USPC ...... 257/773; 257/E23.01; 257/777; 257/686; 257/685; 257/723; 257/717; 257/720; 257/712; 257/713; 257/718; 257/719; 257/721; 257/722; 257/715; 257/716; 257/724; 257/675

(58) Field of Classification Search .................. 257/773, 257/777, E23.01, 686, 685, 723, 728, 717, 257/720, 712, 713, 718, 719, 721, 722, 715, 257/716, 714, 675
See application file for complete search history.

(56) References Cited

U.S. PATENT DOCUMENTS

| | | | |
|---|---|---|---|
| 5,295,044 A | 3/1994 | Araki et al. | |
| 5,766,801 A * | 6/1998 | Inoue et al. | 429/99 |
| 5,847,985 A | 12/1998 | Mitani et al. | |
| 6,452,261 B1 * | 9/2002 | Kodama et al. | 257/688 |
| 7,027,302 B2 * | 4/2006 | Inoue | 361/699 |
| 7,504,720 B2 * | 3/2009 | Nakatsu et al. | 257/712 |
| 7,965,508 B2 * | 6/2011 | Yamamoto et al. | 361/691 |
| 7,981,562 B2 * | 7/2011 | Lee | 429/468 |
| 2005/0218498 A1 * | 10/2005 | Hata et al. | 257/690 |
| 2006/0043562 A1 * | 3/2006 | Watanabe | 257/686 |
| 2006/0096299 A1 | 5/2006 | Mamitsu et al. | |
| 2006/0232939 A1 * | 10/2006 | Inoue | 361/704 |
| 2007/0009775 A1 * | 1/2007 | Lee | 429/26 |
| 2008/0224282 A1 * | 9/2008 | Ashida et al. | 257/669 |

FOREIGN PATENT DOCUMENTS

| | | |
|---|---|---|
| JP | 5-90482 | 4/1993 |
| JP | 9-199537 | 7/1997 |
| JP | 10-107205 | 4/1998 |
| JP | 10-270634 | 10/1998 |
| JP | 2006-165534 | 6/2006 |
| JP | 4225310 | 12/2008 |

* cited by examiner

Primary Examiner — A O Williams
(74) Attorney, Agent, or Firm — Nixon & Vanderhye PC

(57) ABSTRACT

The semiconductor device has a unit stack body including a plurality of units stacked on one another. Each unit includes a power terminal constituted of a lead part and a connection part. The connection part is formed with a projection and a recess. When the units are stacked on one another, the projection of one unit is fitted to the recess of the adjacent unit, so that the power terminals of the respective unit are connected to one another.

9 Claims, 13 Drawing Sheets

SEMICONDUCTOR DEVICE WITH HEAT SPREADERS

This application claims priority to Japanese Patent Applications No. 2010-149671 filed on Jun. 30, 2010, and No. 2011-54368 filed on Mar. 11, 2011, the entire contents of which are hereby incorporated by reference.

BACKGROUND OF THE INVENTION

1. Field of the Invention

The present invention relates to a semiconductor device constituted of a stack of semiconductor modules, each module having a structure in which at least one semiconductor chip formed with a semiconductor power element is resin-molded together with a heat spreader (heat radiating plate) for dissipating heat generated by the semiconductor chip.

2. Description of Related Art

Such a semiconductor device is described, for example, in Japanese Patent Application Laid-open No. 2006-165534. In the semiconductor device described in this patent document, a semiconductor chip formed with semiconductor power element, and a heat spreader for dissipating heat generated by the semiconductor chip are resin-molded as an integrated resin mold section, the resin mold section being formed with a water channel through which cooling water flows. More specifically, the semiconductor chip and the heat spreader are resin-molded in the form of a plate-like unit, and a plurality of the plate-like units are stacked such that the water channels of the respective units are joined to one another.

In the above semiconductor device, each of the units is provided with a bus bar to which its power terminal (positive terminal) is connected, and the bus bars of the respective units are electrically connected with one another by welding or soldering.

The above conventional semiconductor device has a problem in that, since a welding or soldering process has to be performed to connect the power terminals of the respective units with one another through bus connection, the manufacturing cost is high because of its complicated manufacturing process and high components count.

SUMMARY OF THE INVENTION

An embodiment provides a semiconductor device comprising:
a unit stack body including a plurality of units stacked on one another, each unit including:
- a semiconductor chip having a first surface and a second surface opposite to each other and formed with a semiconductor power element;
- a first heat spreader connected to the first surface of the semiconductor chip;
- a second heat spreader connected to the second surface of the semiconductor chip;
- a terminal section electrically connected to the semiconductor power element;
- a resin mold section of a plate shape covering the semiconductor chip, the first and second heat spreaders and the terminal section such that apart of the terminal section is exposed, surfaces of the first and second heat spreaders on the side opposite to the semiconductor chip are exposed, the resin mold section forming a part of a coolant channel through which coolant flows, and
first and second lid sections holding therebetween the unit stack body, wherein
the terminal section of each unit includes a power terminal for supplying a current to the semiconductor power element, the power terminal being constituted of a lead part connected to the first heat spreader, and a connection part connected to the lead part and penetrating through the first and second surfaces,
the connection parts of each adjacent two of the units stacked on one another being electrically connected with each other at the first and second surfaces thereof.

According to the present invention, there is provided a semiconductor device having a unit stack body including a plurality of units stacked on one another which can be manufactured without performing a welding or soldering process to connect power terminals of each adjacent two of the units with each other.

Other advantages and features of the invention will become apparent from the following description including the drawings and claims.

PREFERRED EMBODIMENTS OF THE INVENTION

Figure 1:
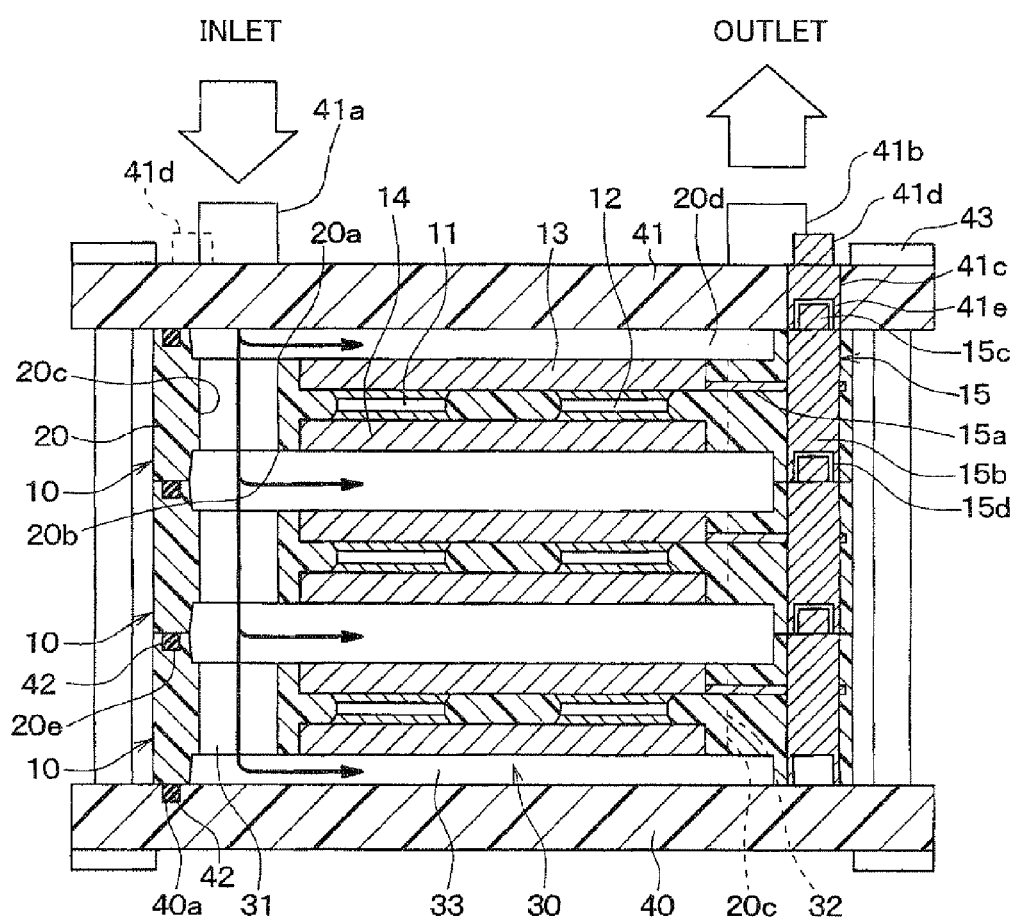
FIG. 1 is a cross-sectional view of a semiconductor device 1 according to a first embodiment of the invention.

In the below described embodiments, the same reference numerals and letters denote the same or equivalent elements or parts.

First Embodiment

FIG. 1 is a cross-sectional view of a semiconductor device 1 according to a first embodiment of the invention.

As shown in FIG. 1, the semiconductor device 1 is constituted of a plurality of semiconductor modules 10 (referred to as units 10 hereinafter) stacked on one another, each unit 10 including various components constituting an inverter which are resin-molded therein.

Figure 2A:
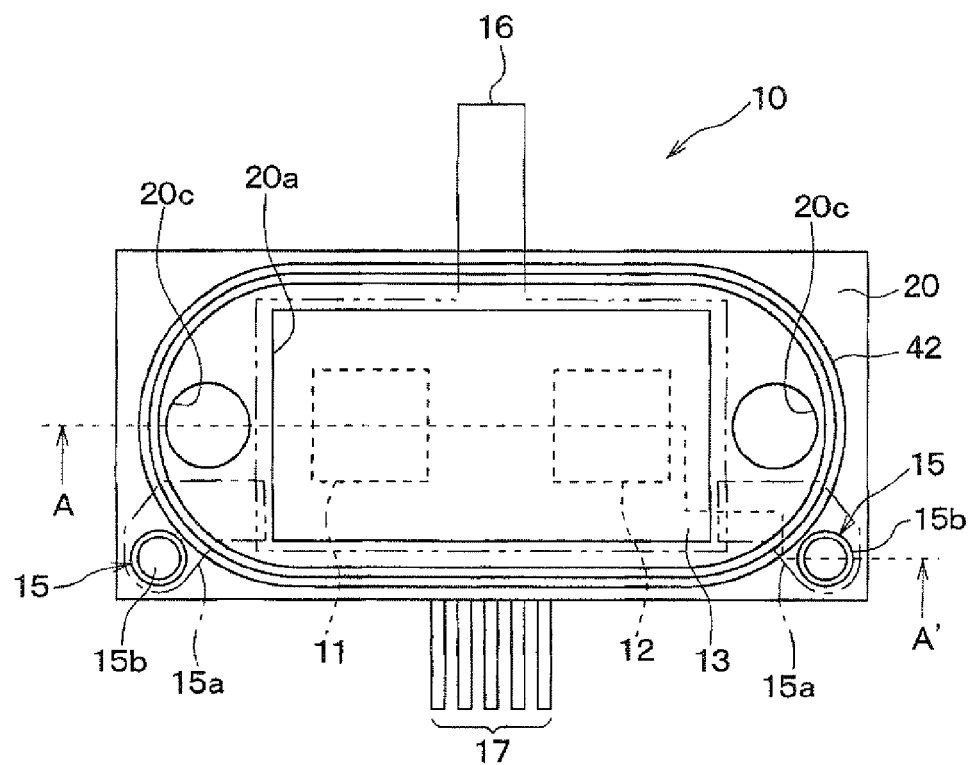
FIG. 2A is a front view of one of units 10 constituting the semiconductor device 1 shown in FIG. 1.
Figure 2B:
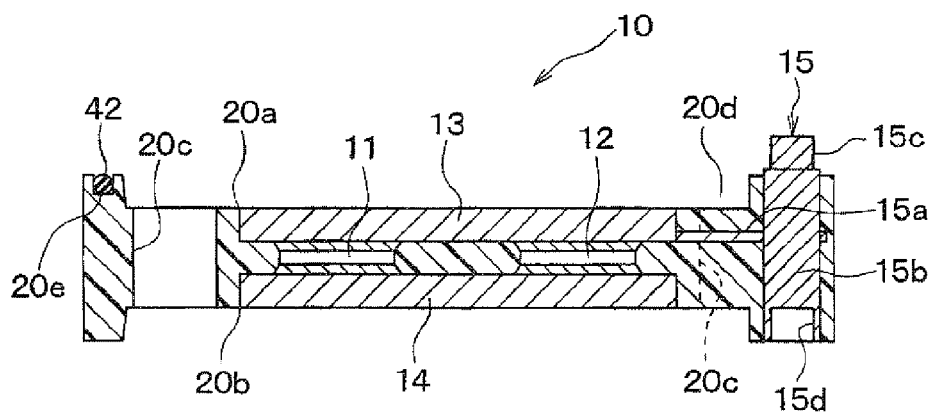
FIG. 2B is a cross-sectional view of the unit 10 taken along the line A-A' shown in FIG. 1.

FIG. 2A is a front view of the unit 10. FIG. 2B is a cross-sectional view of the unit 10 taken along the line A-A' shown in FIG. 1.

As shown in FIGS. 2A and 2B, the unit 10 includes semiconductor chips 11 and 12, heat spreaders 13 and 14, at least one power terminal 15, a negative terminal 16 and a control terminal 17. These components are integrally resin-molded as a resin mold section 20. In this embodiment, each unit 10 has a 1 in 1 structure in which one of the upper and lower arms of each phase of an inverter is molded. However, the unit 10 may have a 2 in 1 structure in which both two arms of an inverter are molded, or a 3 in 1 structure in which three arms of an inverter are molded.

The semiconductor chip 11 is formed with a semiconductor power element such as an IGBT or a power MOSFET (IGBT in this embodiment). The semiconductor chip 12 is formed with a free wheel diode (referred to as "FWD" hereinafter). When the semiconductor device 1 is used for an inverter to drive a three-phase motor, the semiconductor chip 11 is formed with a semiconductor power element constituting one of the upper and lower arms, and the semiconductor chip 12 is formed with a FWD. In this embodiment, each of the semiconductor power element and the FWD is a vertical semiconductor element in which a current flows in the thickness direction of its substrate, and various pads are formed on both surfaces of each of the semiconductor chips 11 and 12. More specifically, the semiconductor chip 11 is formed with pads connected respectively to the gate and emitter of the semiconductor power element at the lower surface thereof (the surface on the lower side in the drawing). The whole of the upper surface (the surface on the upper side in the drawing) serves as a pad connected to the collector of the semiconductor power element. The semiconductor chip 12 is formed with a pad connected to the anode of the FWD at the lower surface thereof (the surface on the lower side in the drawing), and formed with a pad connected to the cathode of the FWD at the upper surface thereof (the surface on the upper side in the drawing).

Although the IGBT and the FWD are respectively formed in the separate semiconductor chips 11 and 12 in this embodiment, they may be formed in the same chip. Further, the semiconductor power element formed in the semiconductor chip 11 may be a lateral semiconductor element in which a current flows in the surface direction of its substrate.

The heat spreaders 13 and 14 serve as heat radiating plates to dissipate heat generated by the semiconductor chips 11 and 12. The heat spreader 13 is not only physically but also electrically connected to the semiconductor chips 11 and 12, so that it serves not only as a heat radiating plate but also as a wire connected to the collector of the IGBT and the cathode of the FWD. Likewise, the heat spreader 14 serves not only as a heat radiating plate but also as a wire connected to the emitter of the IGBT and the anode of the FWD. The heat spreaders 13 and 14 are made of metal having a high heat conductivity such as copper and shaped in a rectangle. Each of the heat spreaders 13 and 14 is exposed from the resin mold section 20 to be exposed to cooling water at one surface thereof opposite to the semiconductor chip 11 or 12.

Although not indicated in the drawings, a metal block is disposed between the heat spreader 14 and each of the semiconductor chips 11 and 12, in order to make a connection between the emitter of the IGBT formed in the semiconductor chip 11 and the heat spreader 14, and a connection between the cathode of the FWD formed in the semiconductor chip 12 and the heat spreader 14. By the provision of such metal blocks, a space can be provided between the heat spreader 14 and the surfaces of the semiconductor chips 11 and 12, which is large enough to facilitate bonding between the control terminal 17 and the pad connected to the gate of the semiconductor chip 11.

The surface of each of the heat spreaders 13 and 14 exposed to the cooling water is covered by an insulating member (not shown) to provide insulation to the cooling water to prevent leak between the cooling water and the heat spreaders 13 and 14.

The power terminal 15 serving as positive terminals for applying the operating voltage to the semiconductor chips 11 and 12 are made of a conductive material. The power terminal 15 is constituted of a lead part 15a joined to the heat spreader 13 integrally or by soldering or welding, and a connection part 15b to make connection among the power terminals 15 of the respective units 10. The power terminal 15 is covered by the resin mold section 20 at other than a predetermined portion of the connection part 15 for insulation and isolation to the cooling water.

The lead part 15a is electrically connected to the pad connected to the collector of the I=formed in the upper surface of the semiconductor chip 11 through the heat spreader 13. One end of the lead part 15a opposite to the heat spreader 13 is connected to the connection part 15b by soldering or welding.

As shown in FIG. 2B, the connection part 15b is disposed penetrating the surfaces of the resin mold section 20. The connection part 15b is formed with a projection 15c on the side of the upper surface of the resin mold section 20 projecting beyond the upper surface of the resin mold section 20, and a recess 15d on the side of the lower surface of the resin mold section 20 having a shape complementary to that of the projection 15c. More specifically, the connection part 15b has a tubular shape of a constant external diameter at the portion covered by the resin mold section 20, formed with the projection 15c having a smaller diameter than that of its tubular shaped portion at one end thereof, and formed with the recess 15d whose diameter is the same as or slightly larger than that of the projection 15c at the other end thereof. Accordingly, since the projection 15c is fitted in the recess 15d of the adjacent unit 10, the power terminals 15 of the respective units 10 can be connected with one another when the units 10 are stacked on one another.

The negative terminal 16 is connected to the negative electrodes of the semiconductor chips 11 and 12. The negative terminal 16 is joined to the heat spreader 14 integrally or by soldering or welding, and electrically connected to the pad connected to the emitter of the semiconductor power element provided in the lower surface of the semiconductor chip 11 and the pad connected to the anode of the FWD provided in the lower surface of the semiconductor chip 11 through the heat spreader 14. One end portion of the negative terminal 16 opposite to the heat spreader 14 is exposed from the resign mold section 20, so that the negative terminal 16 can be connected to an external device through this exposed portion. The power terminals 15 are covered by the resin mold sections 20 throughout their outer periphery, so that the power terminals 15 are isolated from a water channel 30 by the resin mold sections 20 and a later-described O-rings 42.

The control terminal 17 is used for sensing the current flowing through a gate wire of the semiconductor power element or through the semiconductor element, and the temperature of the semiconductor chip 11. The control terminal section 17 is connected to the pads connected to the gate etc. of the semiconductor power element formed in the upper surface of the semiconductor chip 11 through bonding wires (not shown). One end portion of the control terminal 17 opposite to the semiconductor chip 11 is exposed form the resin mold section 20, so that the control terminal 17 can be connected to the external device through this exposed portion. Since a certain space is formed between the surface of the semiconductor chip 11 and heat spreader 14 by the metal blocks, the semiconductor chip 11 and the control terminal 17 can be electrically connected to each other without causing interference between the bonding wires and the heat spreader 14.

The resin mold section 20 is formed by injecting resin into a forming die in which the various components (the semiconductor chips 11 and 12, heat spreaders 13 and 14, power terminal 15, negative terminal 16 and control terminal 17) are set and disposed.

The resin mold section 20 is shaped to expose the projection 15c and recess 15d of the power terminal 15, together with one end portion of the negative terminal 16 and the control terminal 17 from the surface of the resin mold section 20, and expose one surfaces of the heat spreaders 13 and 14 respectively from window portions 20a and 20b of the resin mold section 20. The resin mold section 20 ensures water proofness of the electrical connecting portions of the respective components. The resin mold section 20 has a rectangular plate shape. The negative terminal 16 is drawn from one long side of the resin mold section 20. The control terminal 17 is drawn from the other long side of the resin mold section 20. The connection part 15b of the power terminal 15 is disposed at least one (two in this embodiment) of the four corners of the resin mold section 20.

The resin mold section 20 forms part of the water channel 30 constituting a cooling mechanism of the semiconductor device 1. More specifically, the resin mold section 20 is formed with a passage hole 20c serving as a main water passage at both ends thereof between which the respective components of the unit 10 are located, and formed with a recessed portion 20d at both the upper and lower surfaces thereof. The passage holes 20c and the recessed portions 20d form part of the water channel 30. By stacking a plurality of the units 10, the water channel 30 is completed including the passage holes 20c and the recessed portions 20d of the respective units 10.

Further, the resin mold section 20 is formed with a groove 20e surrounding the recessed portion 20d, in which an O-ring 42 is fitted as a seal member. The O-rings 42 of the respective units 10 stacked on one another ensure sealing between each adjacent two of the units 10 to prevent the cooling water flowing through the water channel 30 as coolant from leaking outside the resin mold sections 20. Since the power terminal 15 is disposed more outward than the O-ring 42, the cooling water can be prevented from leaking from the water channel 30 to the power terminal 15.

As shown in FIG. 1, the semiconductor device 1 is provided with a lid section 40, a lid with pipe section 41, the O-rings 42 and bolts 43 as securing members.

The lid section 40 and the lid with pipe section 41 are disposed respectively at both ends of a stack of the units 10 (referred to as "unit stack body" hereinafter).

The lid section 40 is a plate-like member having a shape corresponding to that of the resin mold sections 20, so that a clearance is formed by the recessed portion 20d between the lid section 40 and the unit 10 disposed at one end of the unit stack body on the side of the lid section 40. The surface of the lid section 40 on the side facing the unit 10 is formed with a groove 40a in which a seal member is fitted.

The lid with pipe section 41 includes a plate-like member having a shape corresponding to that of the resin mold section 20, and two pipes 41a and 41b. One of the pipes 41a and 41b serves as the inlet of the cooling water, and the other serves as the outlet of the cooling water. The pipes 41a and 41b are disposed at the positions corresponding to those of the passage holes 20c. The lid with pipe section 41 is provided with terminal connection parts 41c respectively connected to the connection parts 15b at the portions respectively facing the connection parts 15b, so that the semiconductor device 1 can be supplied with power from an external power source through the terminal connection parts 41c. The terminal connection part 41 is formed with a projection 41d projecting from the lid with pipe section 41 on the side opposite to the unit 10, and a recess 41e in which the projection 15c of the connection part 15b is fitted on the side facing the unit 10.

The O-ring 42, which is a ring-like seal member, is fitted in each of the grooves 20e of the units 10 and the groove 40a of the lid 40 in order to seal between each adjacent two of the units 10, between the unit 10 and the lid section 40, and between the unit 10 and the lid with pipe section 41.

The bolts 43 are tightened to secure the lid section 40 and the lid with pipe section 41 to each other with the O-rings 42 fitted in the grooves 20e and the groove 40a, the lid section 40 being disposed at one end of the unit stack body, and the lid with pipe section 41 being disposed at the other end of the unit stack body. By tightening the bolts 43, the semiconductor device 1 having the water channel 30 formed by the pipes 41a and 41b, the passage holes 20c and the recessed portions 20d is completed. In this semiconductor device 1, the O-rings 42 are pressed by the pressing force of the bolts 43 to provide the necessary sealing. The bolt 43 is a detachable one. By detaching the bolts 43, it is possible to remove the units 10, lid section 40 and lid with pipe section 41 from one another. Each of the lid section 40 and the lid with pipe section 41 is formed with bolt holes. The bolts 43 are inserted into the bolt holes and tightened to complete the semiconductor device 1.

Since the semiconductor device 1 of this embodiment has the structure that the O-rings 42 seals between each adjacent two of the units 10, between the lid section 40 and the unit 10, and between the lid with pipe section 41 and the unit 10, the semiconductor chips 11 included in the respective units 10 can be cooled efficiently while preventing leakage of the cooling water from the water channel 30. More specifically, as shown in FIG. 1, one main water passage 31 is formed by the pipe 41a and one of the two groups of the passage holes 20c formed in the respective units 10, and the other main water passage 32 is formed by the pipe 41b and the other group of the passage holes 20c formed in the respective units 10. Branch water passages 33 are formed by the recessed portions 20d of the respective units 10. Accordingly, as shown in the arrows in FIG. 1, the cooling water let in from the pipe 41a flows to the respective units 10 through the main water passage 31, flows to the main water passage 32, and is discharged from the pipe 41b. Since the heat spreaders 13 and 14 of each unit 10 which are in contact with the cooling water is cooled, the heat generated by the semiconductor chips 11 can be removed efficiently.

The semiconductor device 1 of this embodiment is manufactured by tightening the bolts 43 in the state where the O-rings 42 are fitted in the grooves 20e and 40a, and the unit stack body is held between the lid section 40 and the lid with pipe section 41. At this time, the connection between the terminal connection part 41c of the lid with pipe section 41 and the power terminals 15 of the respective units 10 are ensured by fitting the projections 15c of the connection parts 15b of the power terminals 15 of the respective units 10 into the recesses 15d of the connection parts 15b of the power terminals 15 of the corresponding adjacent units 10, or the recess 41e of the terminal connection part 41c of the lid with pipe section 41.

In the above described semiconductor device 1 of this embodiment, the connection parts 15b of the power terminals 15 of the respective units 10 are electrically connected respectively to the connection parts 15b of the power terminals 15 of the corresponding adjacent units 10 at the time of stacking the units 10 on one another.

More specifically, each unit 10 has the structure that the connection part 15b of the power terminal 15 includes the projection 15c and the recess 15d, and the power terminals 15 of the respective units 10 are located at the same position in the units 10. Accordingly, when the units 10 are stacked on one another, the connection parts 15b of the power terminals 15 of the units 10 are respectively fitted in and electrically connected to those of the corresponding adjacent units 10. Accordingly, the semiconductor device 1 can be manufactured without connecting the power terminals 15 of the units 10 with one another by soldering or welding. Accordingly, since the manufacturing process is simple and the components count is small, the manufacturing cost can be reduced.

Second Embodiment

Next, a second embodiment of the invention is described. Since the second embodiment differs from the first embodiment only in the structure of the power terminal 15, the following description of the second embodiment focuses on the difference with the first embodiment.

Figure 3:
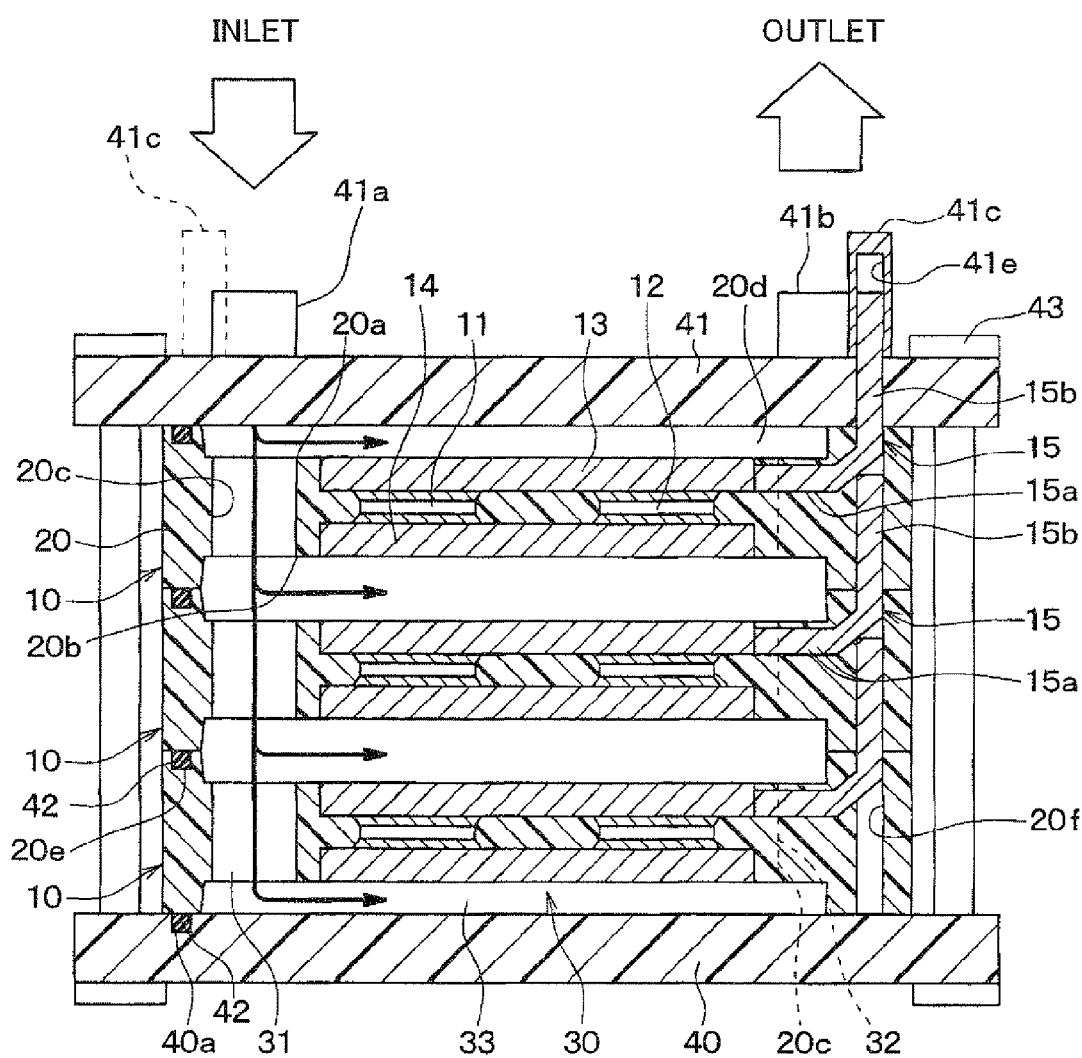
FIG. 3 is a cross-sectional view of a semiconductor device 1 according to a second embodiment of the invention.
Figure 4A:
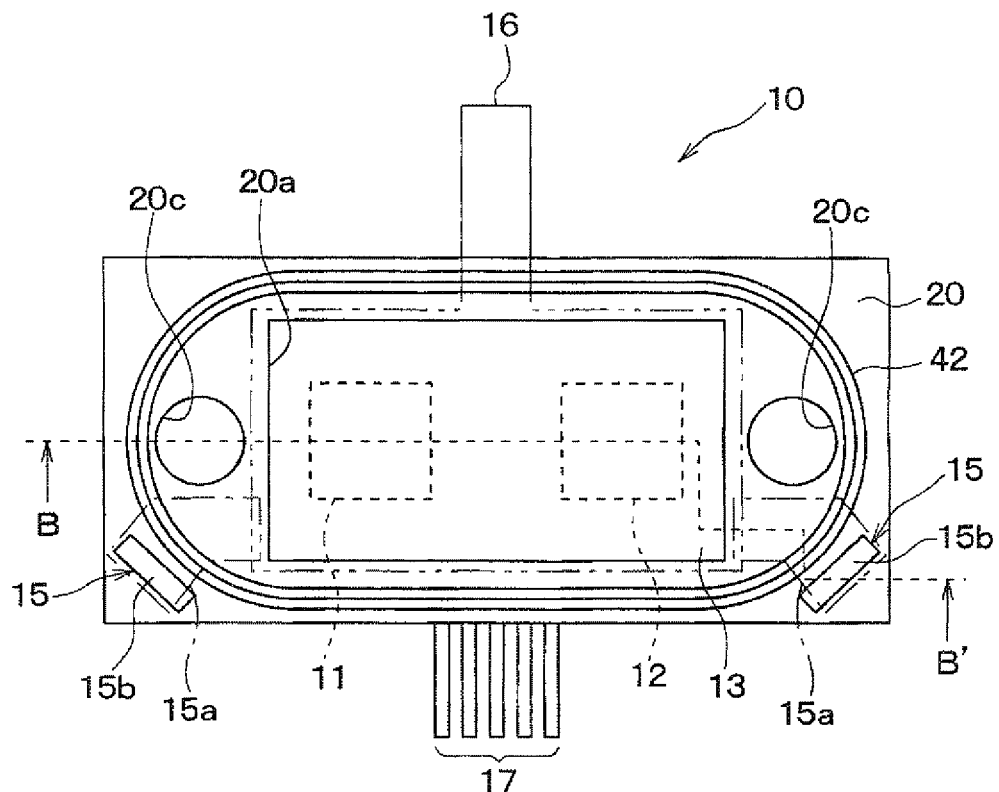
FIG. 4A is a front view of one of units 10 constituting the semiconductor device 1 shown in FIG. 3.
Figure 4B:
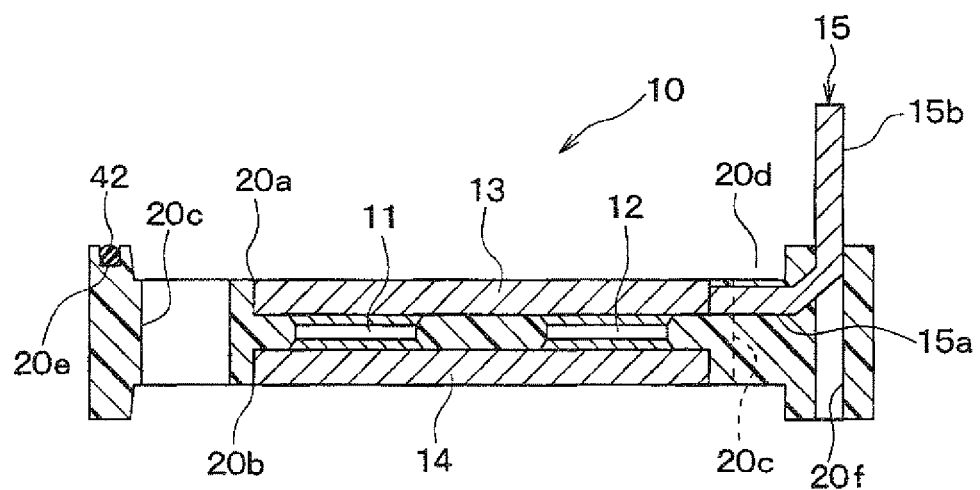
FIG. 4B is a cross-sectional view of the unit 10 taken along the line B-B' shown in FIG. 3.

FIG. 3 is a cross-sectional view of a semiconductor device 1 according to the second embodiment of the invention. FIG. 4A is a front view of one of the units 10 constituting the semiconductor device 1 shown in FIG. 3. FIG. 4B is a cross-sectional view of the unit 10 taken along the line B-B' shown in FIG. 3.

As shown in FIG. 3 and FIGS. 4A and 4B, the semiconductor device 1 of this embodiment is configured such that the structure that the power terminals 15 of the respective units 10 are connected to those of the corresponding adjacent units 10 when the units 10 are stacked on one another, like the semiconductor device 1 of the first embodiment. However, the structure of the power terminal 15 of this embodiment is modified from that of the first embodiment. In this embodiment, the power terminal 15 is a flat-shaped terminal having a part which extends in the surface direction of the heat spreader 13, and is bent midway at right angles with respect to the surface of the heat spreader 13 so that its end portion extends toward the surface of the heat spreader 13. This part extending in the surface direction of the heat spreader 13 forms the lead part 15a, and the end portion bent to extend perpendicularly to the surface of the heat spreader 13 forms the connection part 15b.

The end of the connection part 15b projects from the mold section 20. The mold section 20 is formed with a terminal insertion hole 20f reaching the connection part 15f at is back surface (lower surface). The terminal insertion hole 20f is formed so as to extend perpendicularly to the surface of the heat spreader 13 and to be in alignment with the connection part 15b.

Likewise, the terminal connection part 41c of the lid with pipe section 41 is formed such that the recess 41e thereof has a shape complementary to the shape of the end portion of the connection part 15b of the flat-shaped power terminal 15.

In this embodiment, as shown in FIG. 3, the ends of the connection parts 15b of the power terminals 15 of the respective units 10 are fitted in the terminal insertion holes 20f formed in the resin mold section 20 of the corresponding adjacent units 10 when the units 10 are stacked on one another. In each of the units 20 other than the one in contact with the lid with pipe section 41, the connection part 15b fitted in the terminal insertion hole 20f contacts the power terminal 15 of the resin mold section 20 to be electrically connected with this power terminal 15. In the unit 10 in contact with the lid with pipe section 41, the connection part 15b of the power terminal 15 is fitted in the recess 41e of the terminal connection part 41c of the lid with pipe section 41. In this way, the power terminals 15 of the respective units 10 and the terminal connection part 41c of the lid with pipe section 41 are electrically connected with one another.

As explained above, the same advantages provided by the first embodiment can be provided when the power terminal 15 is a flat-shaped terminal.

Third Embodiment

Next, a third embodiment of the invention is described. Since the third embodiment differs from the first embodiment only in the structure of the power terminal 15 and the fixing structure using the bolts 43, the following description of the third embodiment focuses on the difference with the first embodiment.

Figure 5:
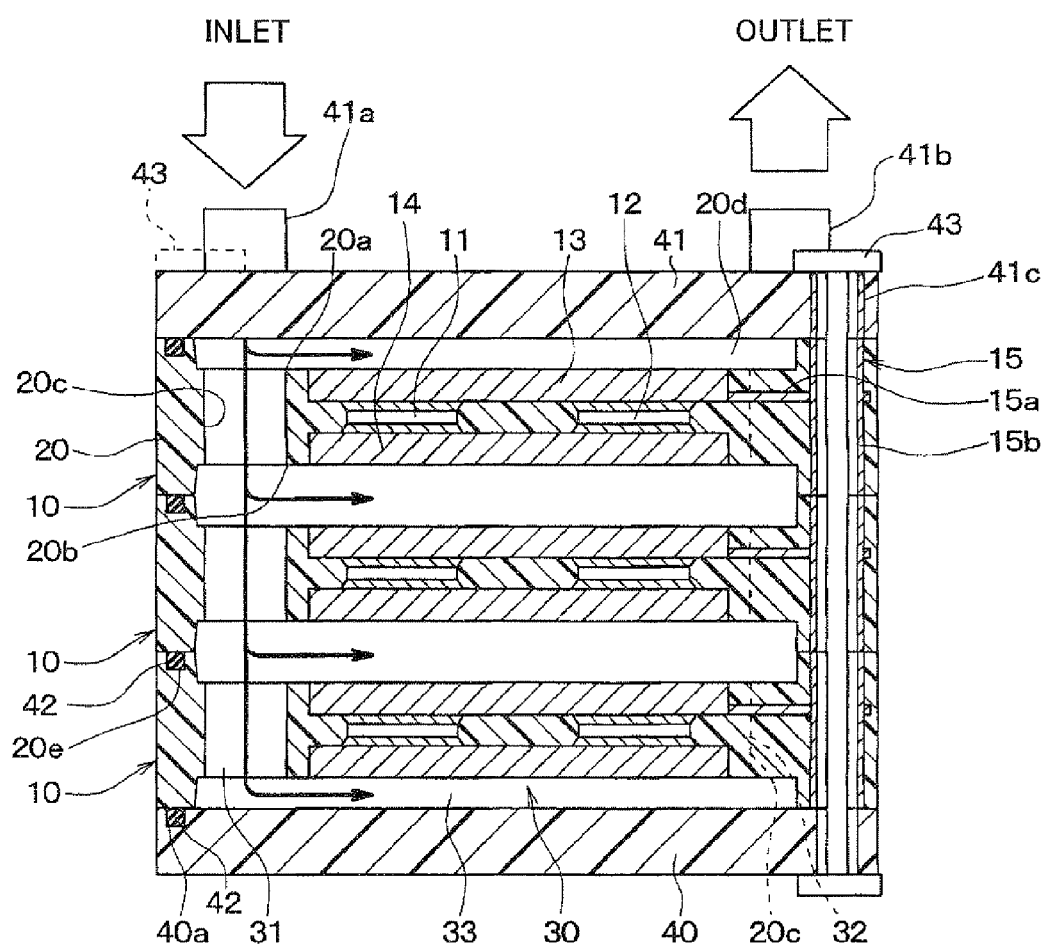
FIG. 5 is a cross-sectional view of a semiconductor device 1 according to a third embodiment of the invention.
Figure 6A:
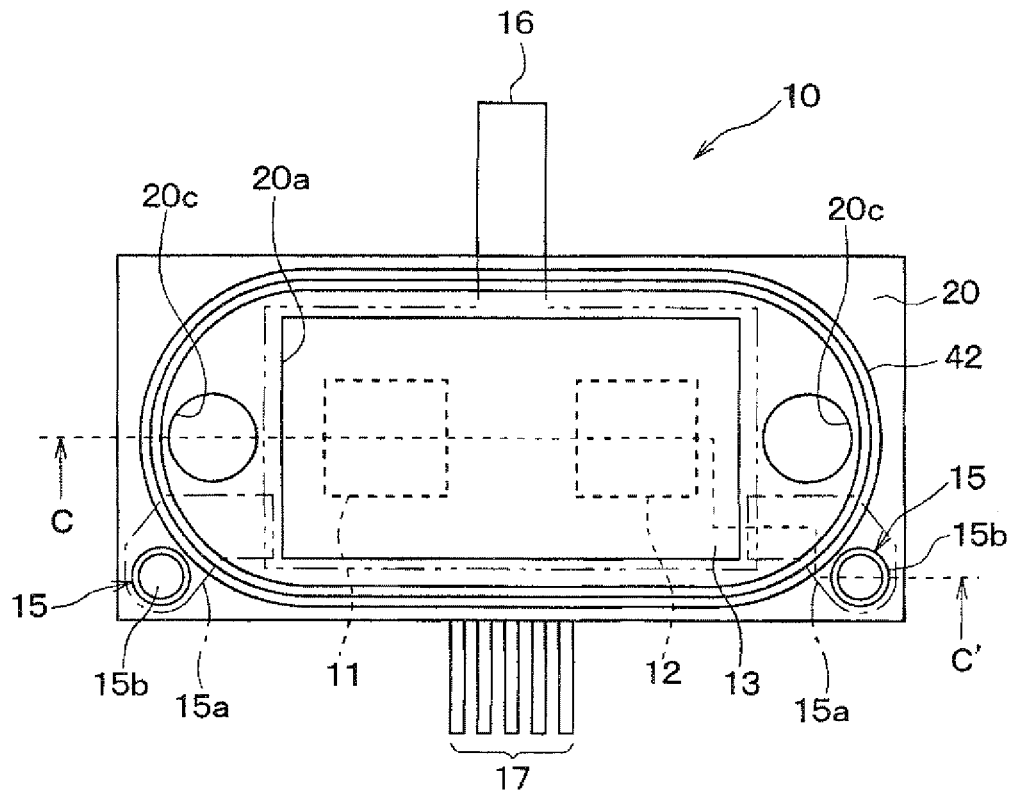
FIG. 6A is a front view of one of units 10 constituting the semiconductor device 1 shown in FIG. 5.
Figure 6B:
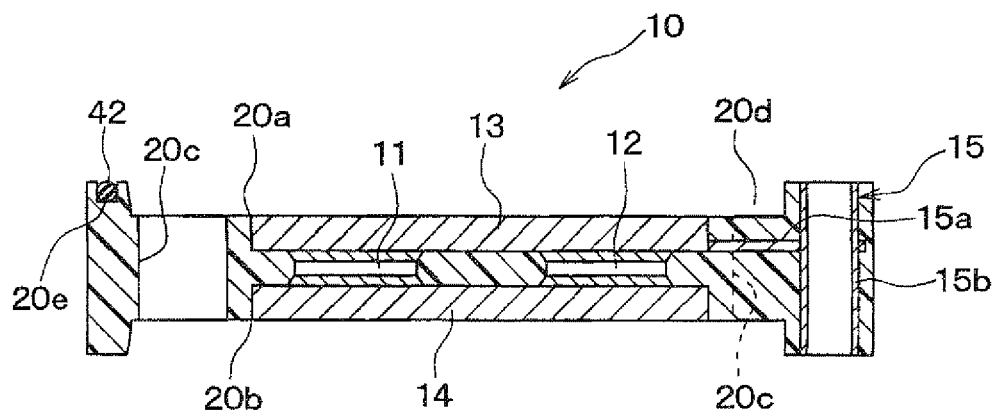
FIG. 6B is a cross-sectional view of the unit 10 taken along the line C-C' shown in FIG. 5.

FIG. 5 is a cross-sectional view of a semiconductor device 1 according to the third embodiment of the invention. FIG. 6A is a front view of one of the units 10 constituting the semiconductor device 1 shown in FIG. 5. FIG. 6B is a cross-sectional view of the unit 10 taken along the line C-C' shown in FIG. 5.

As shown in FIG. 5 and FIGS. 6A and 6B, in this embodiment, the bolt 43 is fitted in the connection part 15b of the power terminal 15. More specifically, as shown in FIG. 6B, the connection part 15b of the power terminal 15 has a shape of a tube having a hollow portion so that a cavity to accommodate the bolt 43 is formed by a succession of the hollow portions of the respective units 10 when the units 10 are stacked on one another.

Likewise, the terminal connection part 41c of the lid with pipe section 41 has a shape of a tube having a hollow portion to accommodate the bolt 43 therein.

Accordingly, the connection parts 15b of the power terminals 15 of the respective units 10 are electrically contacted with one another when the units 10 are stacked on one another as shown in FIG. 5. Further, by securing the lid section 40 and the lid with pipe section 41 to each other with the units 10 being held therebetween by tightening the bolts 43, the bolts 43 are brought to electrical contact with the terminal connection part 41c or the inner surfaces of the hollow portions of the connection parts 15b of the power terminals 15. Accordingly, in this embodiment, the semiconductor device 1 can be supplied with power through the bolts 43.

As explained above, the same advantages provided by the first embodiment can be provided when the connection part 15b of the power terminal 15 is formed with a hollow portion as a bolt hole in which the bolt 43 is fitted.

Modification of Third Embodiment

When the connection part 15b of the power terminal 15 is formed with a hollow portion as a bolt hole in which the bolt 43 is fitted as is the case with the third embodiment, the electrical connection between the bolt 43 and the terminal connection part 41c or between the bolt 43 and the connection portions 15b of the power terminal 15 may not be established sufficiently. In this case, the structure shown in FIG. 7 may be adopted.

Figure 7:
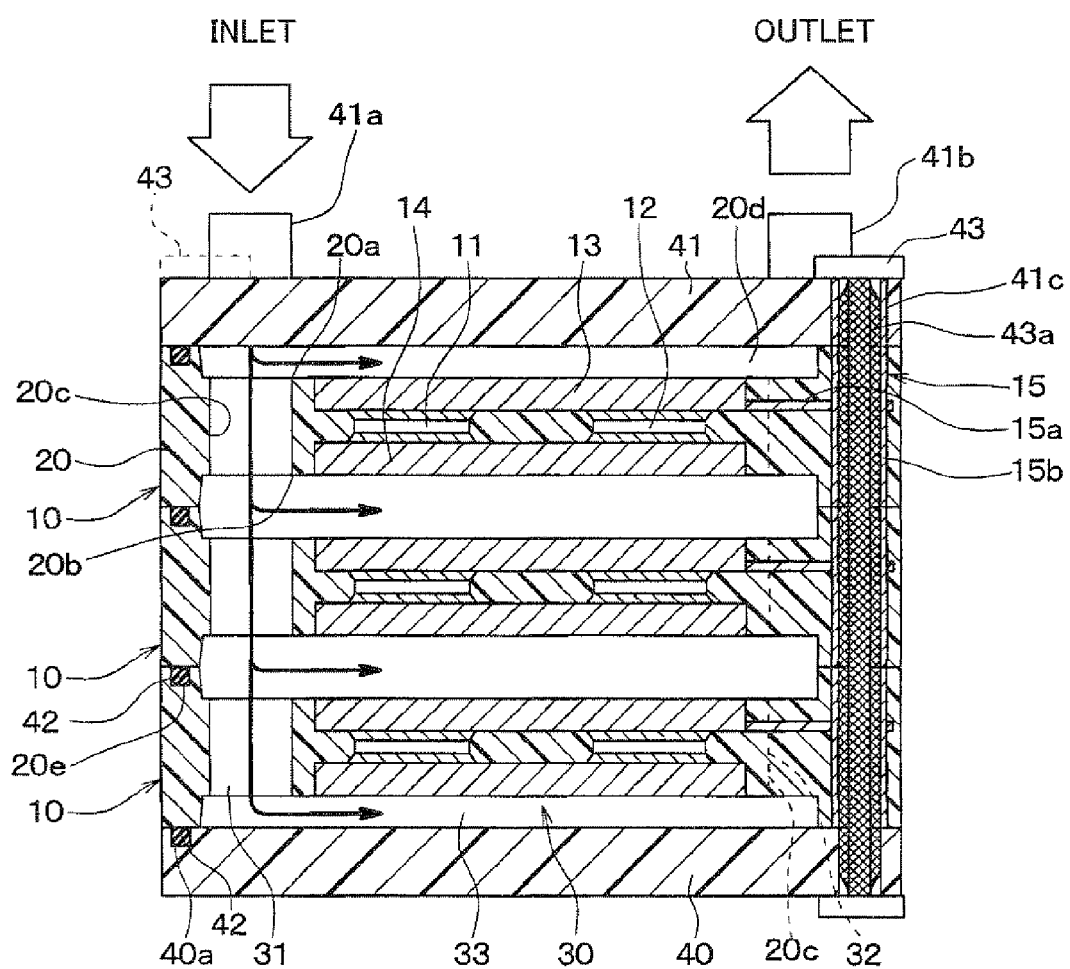
FIG. 7 is a cross-sectional view of a modification of the semiconductor device according to the third embodiment of the invention.

FIG. 7 is a cross-sectional view of a modification of the semiconductor device 1 of the third embodiment. As shown in FIG. 7, in this modification, a tubular meshed metal member 43a is disposed surrounding the bolt 43. The tubular meshed metal member 43a is expanded in diameter by being pressed by both ends of the bolt 43 when the bolt 43 is tightened. As a result, the tubular meshed metal member 43a is brought into contact with the bolt 43 and the inner surfaces of the connection parts 15b of the power terminals 15, to make a secure electrical connection between the power terminals 15 and the bolt 43.

Incidentally, according to this modification, since the bolt 43 is electrically connected to the power terminals 15 through the tubular meshed metal member 43a, the terminal connection part 41c may be eliminated from the lid with pipe section 41.

Fourth Embodiment

Next, a fourth embodiment of the invention is described. The fourth embodiment is directed to a 2 in 1 structure in which the units 10 each including two semiconductor power elements are stacked on one another.

Figure 8:
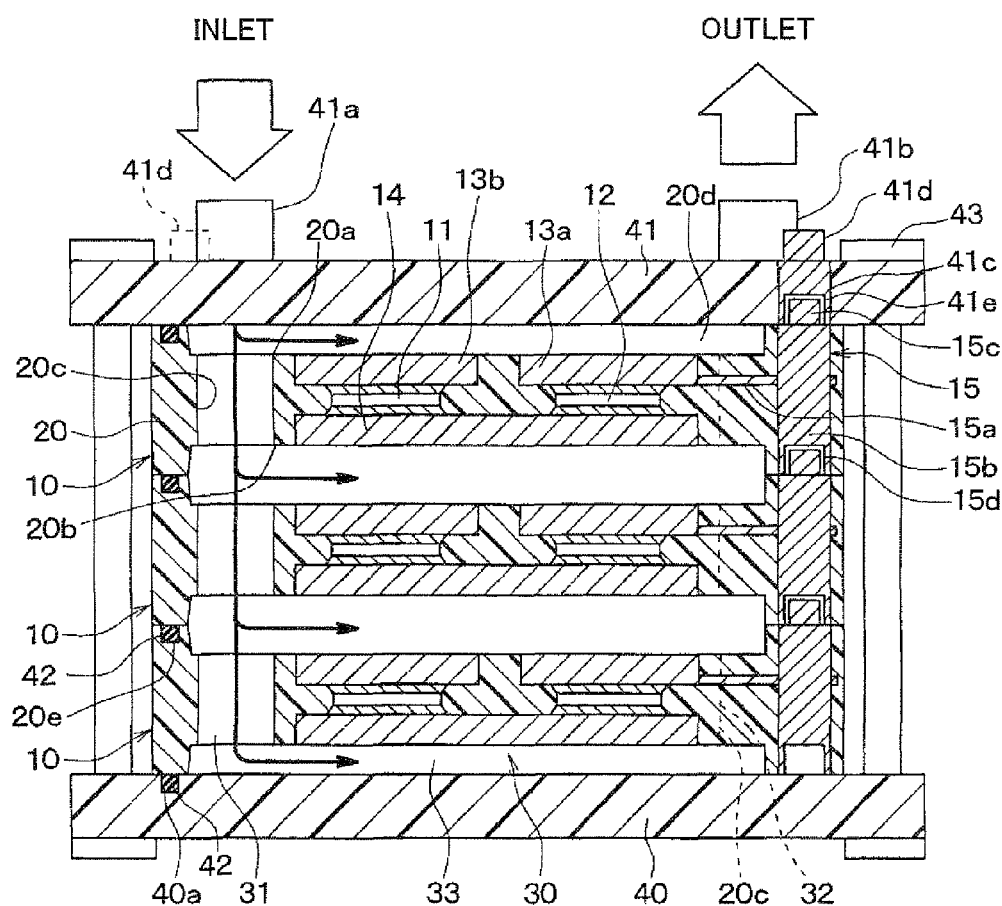
FIG. 8 is a cross-sectional view of a semiconductor device 1 according to a fourth embodiment of the invention.
Figure 9A:
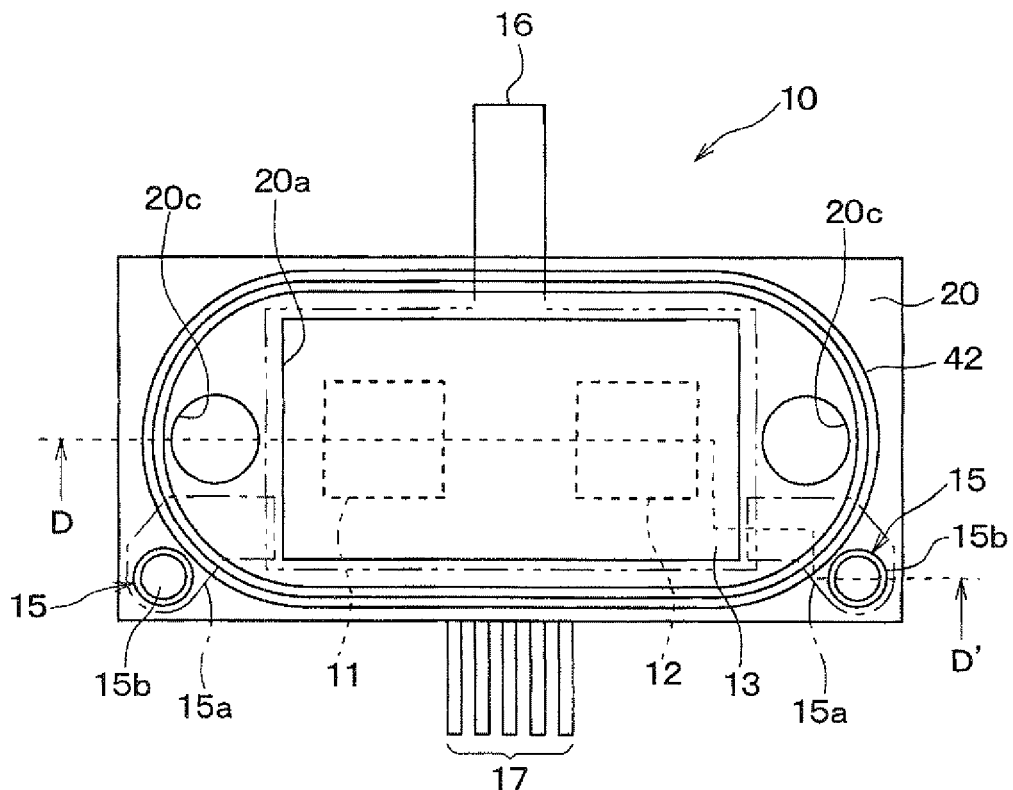
FIG. 9A is a front view of one of units 10 constituting the semiconductor device 1 shown in FIG. 8.
Figure 9B:
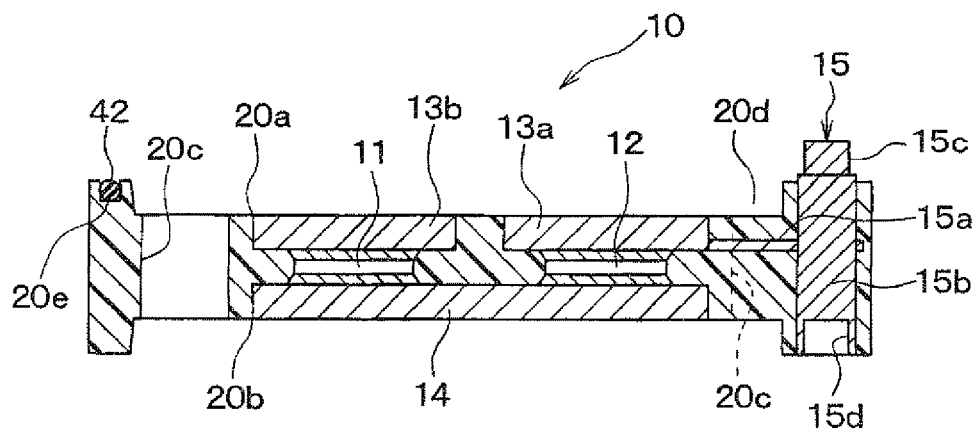
FIG. 9B is a cross-sectional view of the unit 10 taken along the line D-D' shown in FIG. 8.

FIG. 8 is a sectional-view of a semiconductor device 1 according to the fourth embodiment of the invention. FIG. 9A is a front view of one of the units 10 constituting the semiconductor device 1 shown in FIG. 8. FIG. 9B is a cross-sectional view of the unit 10 taken along the line D-D' shown in FIG. 8.

In this embodiment, each of the semiconductor chips 11 and 12 includes an IGBT as a semiconductor power element and a FWD. More specifically, the semiconductor chip 12 includes an IGBT and a FWD constituting an upper arm, and the semiconductor chip 11 includes an IGBT and a FWD constituting a lower arm.

The semiconductor chips 11 and 12 are disposed in opposite orientations. More specifically, in the semiconductor chip 12, the collector of an IGBT and the cathode of a FWD are located at the upper side in the drawing, and the gate and emitter of the IGBT and the anode of the FWD are located at the lower side in the drawing. Conversely, in the semiconductor chip 11, the gate and emitter of the IGBT and the anode of the FWD are located at the upper side in the drawing, and the collector of the IGBT and the cathode of the FWD are located at the lower side in the drawing.

The heat spreader 13 is divided into a first heat spreader 13a and a second spreader 13b. The first heat spreader 13a is connected to the upper surface of the semiconductor chip 12, and the second heat spreader 13b is connected to the upper surface of the semiconductor chip 11. On the other hand, the heat spreader 14 is commonly used for the upper and lower arms. The heat spreader 14 is connected to the lower surfaces of the semiconductor chips 11 and 12.

The first heat spreader 13a is connected with the power terminal 15 having the same structure as that of the power terminal 15 of the first embodiment.

As described above, the semiconductor device 1 having the 2 in 1 structure can be provided with the power terminals 15 having the same structure as that of the power terminals 15 of the first embodiment. Accordingly, according to the fourth embodiment, the same advantages as those provided by the first embodiment can be provided.

Fifth Embodiment

Next, a fifth embodiment of the invention is described. Since the fifth embodiment differs from the first embodiment only in the structure of the power terminal 15, the following description of the fifth embodiment focuses on the difference with the first embodiment.

In the above embodiments, the connection part 15b of the power terminal 15 is disposed outside the seal member (O-ring). However, the connection part 15b may be disposed inside the seal member if the connection part 15b is insulated, for example, by being covered by an insulating film at other than a portion for electrical connection among the respective units 10. That is, the connection part 15b can be disposed within the water channel 30 if the connection part 15b is substantially insulated from the outside.

Figure 10:
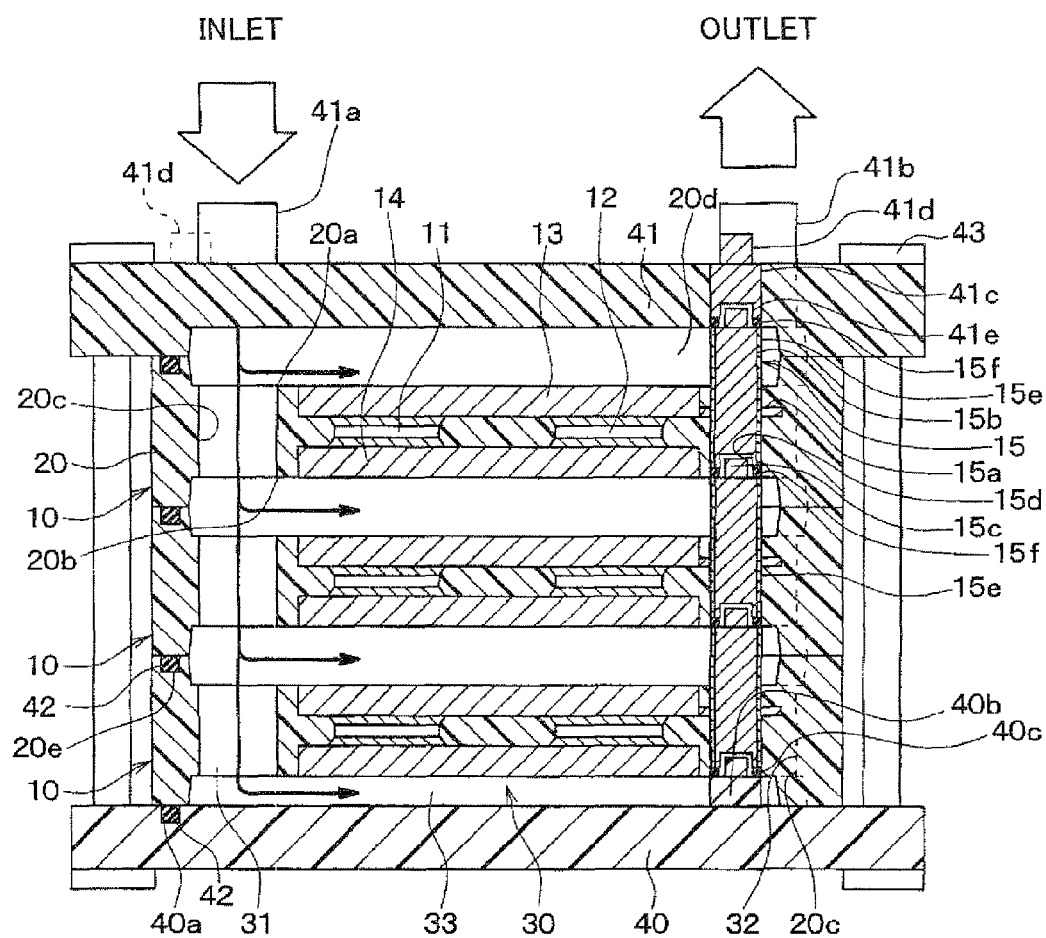
FIG. 10 is a cross-sectional view of a semiconductor device 1 according to a fifth embodiment of the invention.
Figure 11A:
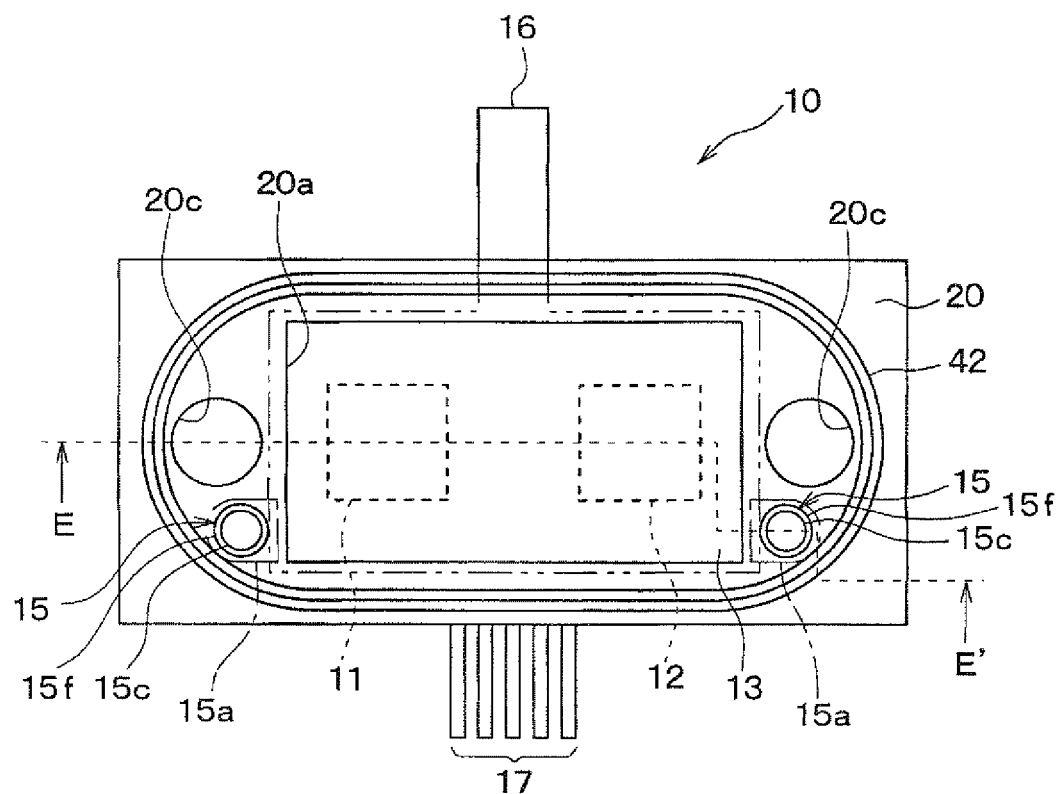
FIG. 11A is a front view of one of units 10 constituting the semiconductor device 1 shown in FIG. 10.
Figure 11B:
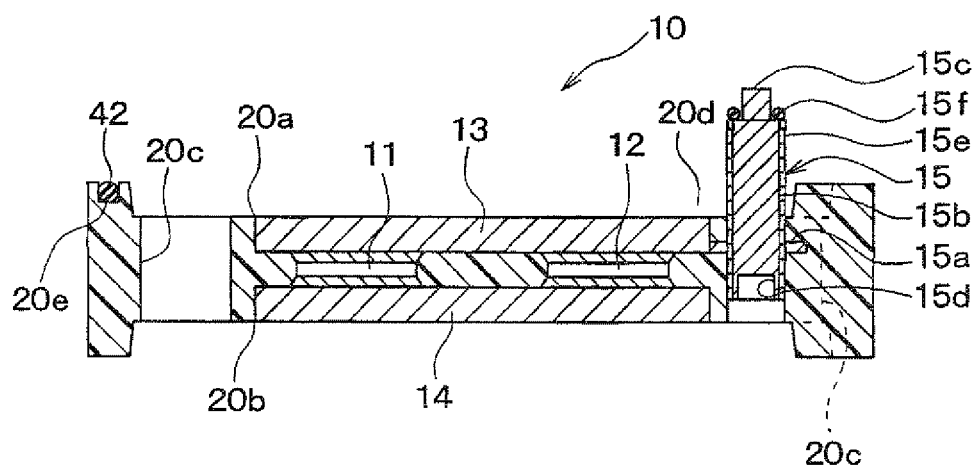
FIG. 11B is a cross-sectional view of the unit 10 taken along the line E-E' shown in FIG. 10.

FIG. 10 is a sectional-view of a semiconductor device 1 according to the fifth embodiment of the invention. FIG. 11A is a front view of one of the units 10 constituting the semiconductor device 1 shown in FIG. 10. FIG. 11B is a cross-sectional view of the unit 10 taken along the line E-E' shown in FIG. 10.

As shown in FIG. 10 and FIGS. 11A and 11B, in this embodiment, the connection part 15b of the power terminal 15 is formed so as to penetrate the upper and lower surfaces of the resin mold section 20 as in the case of the first embodiment. However, the position of the penetration is different from that in the first embodiment. More specifically, in this embodiment, the connection part 15b of the power terminal 15 is disposed inside the O-ring 42 so as to extend within the water channel 30 constituting the coolant passage. The outer periphery of the connection part 15b of the power terminal 15 is covered by an insulating film 15e. An O-ring 15f as a seal member is disposed at the position at which the projection 15c and the recess 15d face with each other, and the position at which the projection 15c and the recess 41e of the terminal connection part 41c of the pipe with lid section 40 face with each other. In the above described structure, the O-ring 15f is held between the connection parts 15b of each adjacent two of the units 10 to isolate and seal the projections 15c and the recesses 15d located inside the O-rings 15f from the water channel 30.

Incidentally, in this embodiment, to connect the connection parts 15b of the respective units 10 to one another within the water channel 30, the recess 15d of the connection part 15b is disposed at a position more recessed than the bottom of the recessed portion 20d of the resin mold section 20, so that the O-ring 15f enters the resin mold section 20. Accordingly, the recess 15d of the connection part 15b is exposed to the water channel 30 at the side of the lid section 40. Hence, the lid section 40 also is provided with a projection 40b at a position corresponding to the recess 15d of the connection part 15b, and the O-ring 40c is provided surrounding the projection 40b, so that the recess 15d of the connection part 15b is not exposed to the water channel 30 at the side of the lid section 40.

As explained above, it is possible that the connection part 15b of the power terminal 15 is disposed so as to extend within the water channel 30. In the above described structure, by covering the connection part 15b by the insulating film 15e to insulate the connection part 15b from the cooling water (coolant) in the water channel 30, it is possible to prevent electric leak from the power terminal 15. According to the fifth embodiment, the same advantages as those provided by the first embodiment can be provided.

Sixth Embodiment

Next, a sixth embodiment of the invention is described. Since the sixth embodiment differs from the first embodiment only in the structure of the power terminal 15, the following description of the fifth embodiment focuses on the difference with the first embodiment.

Figure 12:
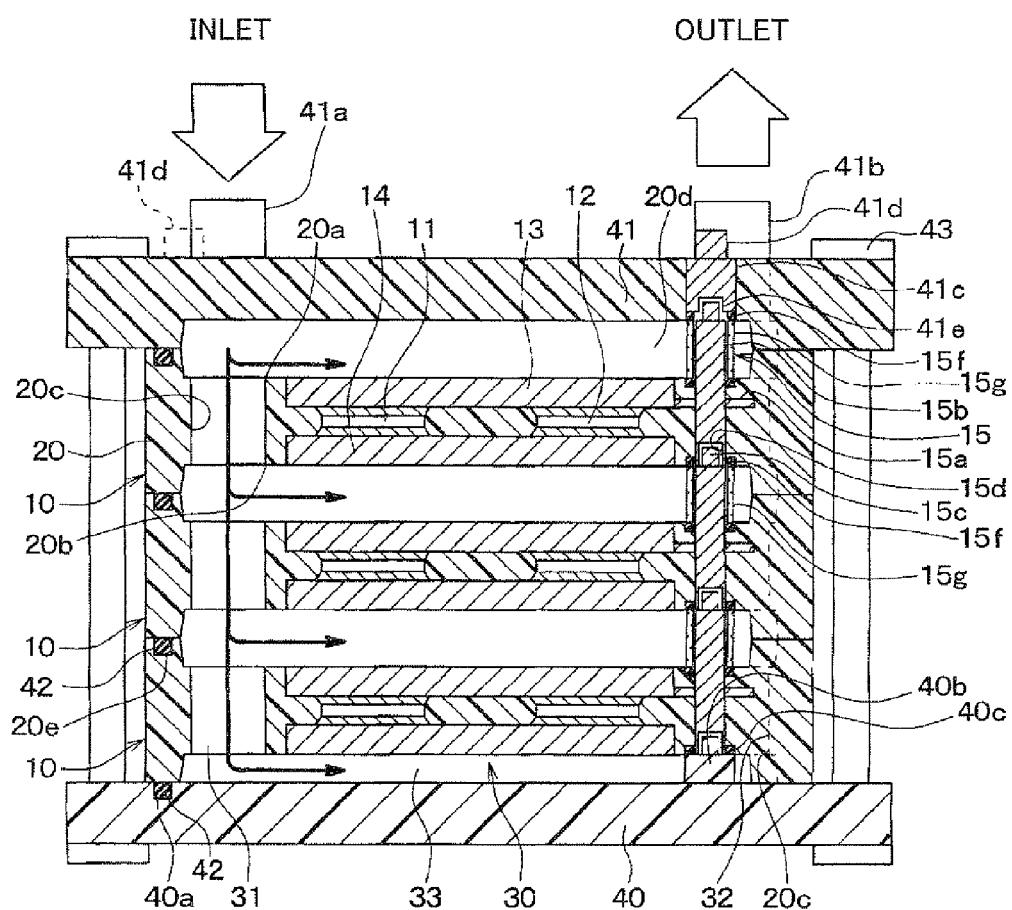
FIG. 12 is a cross-sectional view of a semiconductor device according to a sixth embodiment of the invention.
Figure 13A:
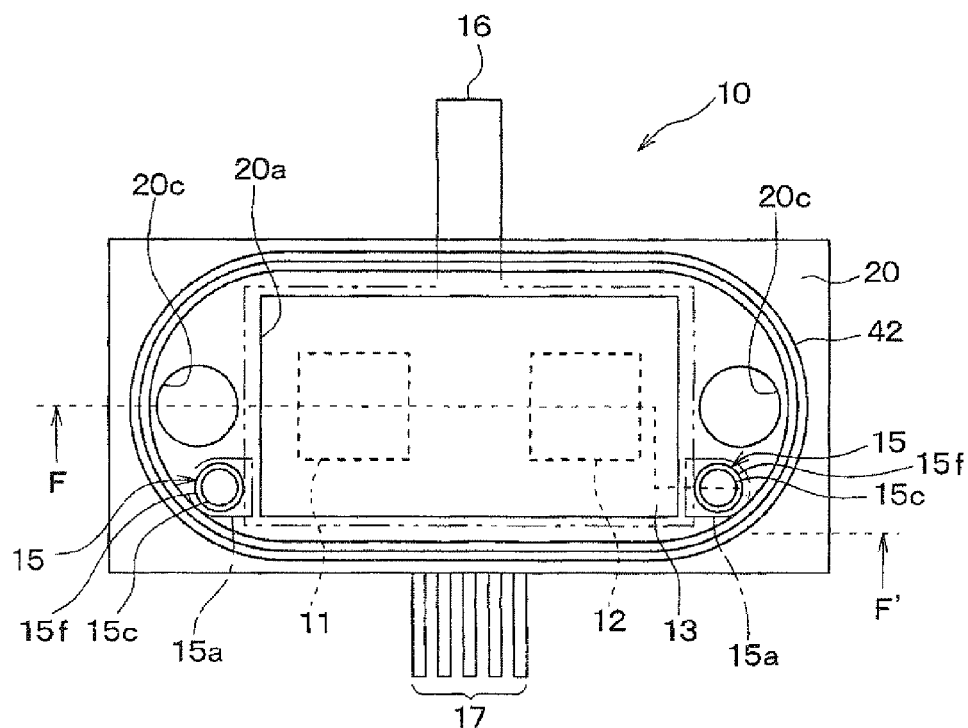
FIG. 13A is a front view of one of units 10 constituting the semiconductor device 1 shown in FIG. 12.
Figure 13B:
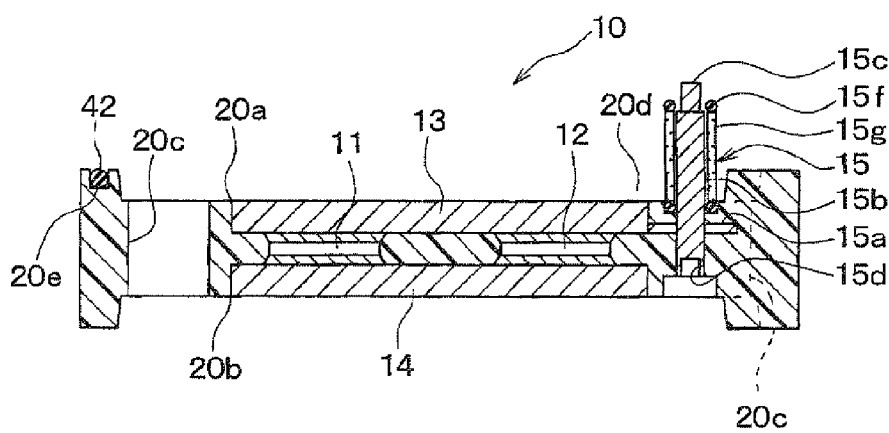
FIG. 13B is a cross-sectional view of the unit 10 taken along the line F-F' shown in FIG. 12.

FIG. 12 is a sectional-view of a semiconductor device 1 according to the sixth embodiment of the invention. FIG. 13A is a front view of one of the units 10 constituting the semiconductor device 1 shown in FIG. 12. FIG. 13B is a cross-sectional view of the unit 10 taken along the line F-F shown in FIG. 12.

As shown in FIG. 12 and FIGS. 13A and 13B, in this embodiment, the connection part 15b of the power terminal 15 is disposed inside the O-ring 42 so as to extend within the water channel 30 constituting the coolant passage as in the case of the fifth embodiment. However, in this embodiment, the connection part 15b is disposed such that its portion located within the water channel 30 is surrounded by an insulating tube 15g, and O-rings 14f are disposed at both ends of the insulating tube 15g. According to the above described structure, a portion not covered by the resin mold section 20 of the connection part 15b can be isolated from the water channel 30, and sealing between the connection part 15b and the water channel 30 is ensured by the insulating tube 15 and the O-rings 14f.

As explained above, when the power terminal 15 is disposed such that the connection part 15b extends within the water channel 30, the connection part 15b may be surrounded by the insulating tube 14g only at its portion exposed from the resin mold section 20, and the O-rings 14f may be disposed at both ends of the insulating tube 14g. According to the sixth embodiment, the same advantages as those provided by the first embodiment can be provided.

Other Embodiments (1) In the first embodiment, the unit stack body is secured to the lid section 40 and the lid with pipe section 41 by the bolts 43. However, the unit stack body may be secured to the lid section 40 and the lid with pipe section 41 by appropriate means other than bolts. For example, instead of the bolts, there may be used a fixture provided with hooks at its both ends, the distance between the hooks being smaller than the width of the semiconductor device 1 including the lid section 40, the lid with pipe section 41 and the units 10 stacked on one another, so that the units 10 are held firmly between the lid section 40 and the lid with pipe section 41 by resilient force of the hooks.

The units 10, the lid section 40 and the lid with pipe section 41 may be adhered to one another. In this case, the O-rings 42 may be eliminated if the adhesion provides necessary sealing. Also in this case, by disposing the connection parts 15b of the power terminals 15 more outward than adhesion portions of the units 20, the lid section 40 and the lid with pipe section 41, it is possible to prevent the cooling water from contacting the connection parts 15b.

(2) In the above embodiments, each unit 10 is provided with the power terminal 15 at two positions. However, each unit 10 may be provided with the power terminal 15 at a single position or three or more positions.

(3) In the above embodiments, each of the lid section 40 and the lid with pipe section 41 is made of insulating material. However, they may be made of conductive material. In this case, the terminal connection part 41c is covered by an insulating film so that it is insulated from the lid with pipe section 41.

In the above embodiments, the lid with pipe section 41 is provided with the terminal connection part 41c to be electrically connected with the power terminals 15 of the respective units 20. However, the terminal connection part 41c may be provided in the lid section 40 disposed at the opposite side of the pipes 41a and 41b serving as the inlet and outlet of the cooling water, so that the semiconductor device 1 is supplied with power from the side opposite to the pipes 41a and 41b.

(4) The fourth embodiment is an example of the 2 in 1 structure in which the semiconductor chips 11 and 12 are disposed in opposite orientation. However, the semiconductor chips 11 and 12 may be disposed in the same orientation. In this case, each of the heat spreaders 13 and 14 is divided into two parts, the two parts of each of the heat spreaders 13 and 14 are respectively connected to the upper surface and lower surface of the semiconductor chip 11 or 12, and the emitter of the IGBT and the anode of the FWD of the upper arm are connected to the collector of the IGBT and the cathode of the FWD of the lower arm through a connection member.

(5) The fourth embodiment is an example of the 2 in 1 structure in which the power terminal 15 has the same structure as that of the power terminal 15 used in the first embodiment. However, the fourth embodiment may use the power terminal 15 having the same structure as that of the power terminal 15 used in the second, third, fifth or sixth embodiment, or the modification of the third embodiment.

(6) In the above embodiments, each of the heat spreaders 13 and 14 has a rectangular shape. However, they may have a shape other than a rectangle, so that they have a larger surface to have a higher heat dissipation efficiency. For example, the heat spreaders 13 and 14 not connected to the power terminal 15 may be formed with a notch allowing the power terminal 15 to pass through while making no contact with the power terminal 15.

(7) In the above embodiments, the resin mold section 20 has a rectangular plate shape.

However, it may be any plate-like shape, such as an oval-plate shape.

(8) In the sixth embodiment using the insulating tube 14g, the connection part 15b of the power terminal 15 has the same shape as that of the power terminal 15 in the first embodiment. However, in the case in which the semiconductor device 1 uses the insulating tube 14g, the power terminal 15 may be one having a flat shape as shown in the second embodiment.

(9) The semiconductor devices of the above described embodiments have the structure in which the power terminals of the respective units are electrically connected with one another when the units are stacked on one another. However, the present invention can be used also when the terminals for supplying the operating current to the semiconductor power elements other than the power terminals, for example, the negative terminals of the lower arms of an inverter are connected with one another. Further, the present invention is applicable to a semiconductor device having a 2 in 1 structure in which not only the power terminals but also the negative terminals are connected with one another.

The above explained preferred embodiments are exemplary of the invention of the present application which is described solely by the claims appended below. It should be understood that modifications of the preferred embodiments may be made as would occur to one of skill in the art.

What is claimed is:

1. A semiconductor device comprising:
a unit stack body including a plurality of units stacked on one another, each unit including:
a semiconductor chip having a first surface and a second surface opposite to each other and formed with a semiconductor power element;
a first heat spreader connected to the first surface of the semiconductor chip;
a second heat spreader connected to the second surface of the semiconductor chip;
a terminal section electrically connected to the semiconductor power element;
a resin mold section of a plate shape covering the semiconductor chip, the first and second heat spreaders and the terminal section such that a part of the terminal section is exposed, surfaces of the first and second heat spreaders on the side opposite to the semiconductor chip are exposed, the resin mold section forming a part of a coolant channel through which coolant flows, and
first and second lid sections holding therebetween the unit stack body,
wherein
the terminal section of each unit includes a power terminal for supplying a current to the semiconductor power element, the power terminal being constituted of a lead part connected to the first heat spreader, and a connection part connected to the lead part and penetrating through the first and second surfaces,
the connection parts of each adjacent two of the units stacked on one another being electrically connected with each other at the first and second surfaces thereof.

2. The semiconductor device according to claim 1, wherein the connection part is made of a member penetrating through the first and second surfaces of the resin mold section, one end of the member being formed with a projection projecting from the resin mold section, the other end of the member being formed with a recess having a shape corresponding to a shape of the projection, the connection parts of each adjacent two of the respective units being electrically connected to each other through contact between the recess and the projection fitted in the recess.

3. The semiconductor device according to claim 1, wherein the power terminal has a flat shape, the connection part projecting from the first surface of the resin mold section at one end thereof and formed with a terminal insertion hole at a position of the second surface of the resin mold section, the connection parts of each adjacent two of the respective units being electrically connected to each other through contact between the terminal insertion hole and the one end of the connection part being fitted in the insertion hole.

4. The semiconductor device according to claim 1, further comprising seal section formed so as to surround the coolant channel to seal between each adjacent two of the units, the connection parts being located outside the seal section.

5. The semiconductor device according to claim 1, wherein the connection part is disposed so as to extend within the coolant channel, and is covered by an insulating member at at least a portion exposed from the resin mold section, so that the connection part is insulated from coolant flowing through the coolant channel.

6. The semiconductor device according to claim 5, wherein the insulating member is formed as an insulating tube, a portion of the connection part exposed from the resin mold section is surrounded by the insulating tube, and the insulating tube is provided with a seal member at both ends thereof such that the portion of the connection part exposed from the resin mold section is isolated from the coolant channel, sealing between the connection part and the coolant channel being ensured by the insulating tube and the seal member.

7. The semiconductor device according to claim 4, wherein the seal section is a ring seal, and the unit stack body is secured to the first and second lid sections by a fixing member holding the unit stack body between the first and second lid sections.

8. The semiconductor device according to claim 1, wherein
the unit stack body is secured to the first and second lid sections by at least one bolt tightened to hold the unit stack body between the first and second lid sections,
the connection part is a tubular member having a hollow portion and penetrating through the first and second surfaces of the resin mold section,
the bolt is fitted in the hollow portions of the connection parts of the respective units, such that the unit stack body is fixed to the first and second lid sections and the power terminals of the respective units are electrically connected to the bolt.

9. The semiconductor device according to claim 8, further comprising a tubular meshed metal member surrounding an outer periphery of the bolt, the tubular meshed metal member being expanded in diameter when the bolt is tightened so that inner surfaces of the connection portions of the power terminals of the respective units are electrically connected to the bolt.

* * * * *